(12) United States Patent
Prüssmeier

(10) Patent No.: US 10,033,373 B2
(45) Date of Patent: Jul. 24, 2018

(54) HALF BRIDGE HAVING TWO SEMICONDUCTOR SWITCHES FOR OPERATING A LOAD

(71) Applicant: BECKHOFF AUTOMATION GMBH, Verl (DE)

(72) Inventor: Uwe Prüssmeier, Lemgo (DE)

(73) Assignee: BECKHOFF AUTOMATION GMBH, Verl (DE)

( * ) Notice: Subject to any disclaimer, the term of this patent is extended or adjusted under 35 U.S.C. 154(b) by 0 days.

(21) Appl. No.: 15/476,170

(22) Filed: Mar. 31, 2017

(65) Prior Publication Data

US 2017/0207781 A1   Jul. 20, 2017

Related U.S. Application Data

(63) Continuation of application No. PCT/EP2015/073834, filed on Oct. 15, 2015.

(30) Foreign Application Priority Data

Oct. 15, 2014   (DE) .......................... 10 2014 114 954

(51) Int. Cl.
| | |
|---|---|
| *H03K 17/16* | (2006.01) |
| *H03K 17/0814* | (2006.01) |
| *H02M 1/34* | (2007.01) |

(52) U.S. Cl.
CPC ............ *H03K 17/162* (2013.01); *H02M 1/34* (2013.01); *H03K 17/08142* (2013.01); *H02M 2001/342* (2013.01); *H03K 2217/0036* (2013.01)

(58) Field of Classification Search
CPC combination set(s) only.
See application file for complete search history.

(56) References Cited

U.S. PATENT DOCUMENTS

| | | | |
|---|---|---|---|
| 4,446,513 | A | 5/1984 | Clenet |
| 5,341,004 | A | 8/1994 | Furuhata |
| (Continued) | | | |

FOREIGN PATENT DOCUMENTS

| | | |
|---|---|---|
| AT | 505802 A1 | 4/2009 |
| DE | 3542751 A1 | 6/1987 |
| (Continued) | | |

*Primary Examiner* — An Luu
(74) *Attorney, Agent, or Firm* — Dorsey & Whitney LLP

(57) ABSTRACT

To operate a load a half bridge includes a switching device with a high-side semiconductor switch and a low-side semiconductor switch. The semiconductor switches are connected in series via their current terminals, and each semiconductor switch may be assigned, via its control terminal, a driving system that switches the respective semiconductor switch on or off according to a drive signal. The load is connectable between the high-side and low-side semiconductor switches. The half bridge may include a load relief device connected to the switching device, e.g., in order to collect energy during a switching process in the switching device. The half bridge can\include an energy recovery circuit configured to feed the energy collected by the load relief device, e.g., a current, to an energy storage device before a further energy collection, e.g., current collection, of the load relief device, during a further switching process in the switching device.

16 Claims, 2 Drawing Sheets

(56) References Cited

U.S. PATENT DOCUMENTS

| | | | |
|---|---|---|---|
| 6,933,681 B2* | 8/2005 | Rudolph | H05B 41/28 |
| | | | 315/219 |
| 2002/0135341 A1 | 9/2002 | Eagar | |
| 2009/0251065 A1* | 10/2009 | Niedermeier | H05B 33/0815 |
| | | | 315/291 |
| 2011/0062935 A1 | 3/2011 | Gray et al. | |

FOREIGN PATENT DOCUMENTS

| | | |
|---|---|---|
| DE | 69312585 T2 | 2/1998 |
| EP | 0573836 A2 | 12/1993 |

* cited by examiner

HALF BRIDGE HAVING TWO SEMICONDUCTOR SWITCHES FOR OPERATING A LOAD

CROSS-REFERENCE TO RELATED APPLICATIONS

This application claims priority to International Patent Application No. PCT/EP2015/073834, filed 15 Oct. 2015, entitled HALF BRIDGE HAVING TWO SEMICONDUCTOR SWITCHES FOR OPERATING A LOAD, which claims priority to German patent application DE 10 2014 114 954.8, filed Oct. 15, 2014, entitled HALBBRÜCKE MIT ZWEI HALBLEITERSCHALTERN ZUM BETREIBEN EINER LAST, each of that is incorporated by reference herein, in the entirety and for all purposes.

FIELD

This disclosure relates to a half bridge for operating a load. Embodiments may comprise one or more of a switching device having a high-side semiconductor switch and a low-side semiconductor switch, which are connected to one another in series in each case via one of their current terminals. Each semiconductor switch may be assigned, via a control terminal, a driving system that switches the respective semiconductor switch on or off according to a drive signal, e.g., where the load is connectable between the high-side and low-side semiconductor switches, and a load relief device, e.g., connected to the switching device in order to collect energy during a switching process in the switching device.

BACKGROUND

Power electronic circuits often comprise semiconductor switches that are used to supply a load with a power. In some instances high power losses may be dissipated in the semiconductor switches if a high current flows through a semiconductor switch and at the same time a high voltage is present across said component. Such power losses arise in particular during a switchover process.

In order to avoid damage to and/or an adverse effect on the lifetime of a semiconductor switch as a result of dissipated power loss, a switching frequency with that the semiconductor switch is switched over may be limited. However, such a limitation is at odds with the demand for the highest possible switching frequencies enabling control of a load to be improved.

A further possibility for reducing switching losses consists in a reduction of the switching time. However, under certain circumstances a higher switching time has a negative effect on the EMC behavior (electromagnetic compatibility EMC) of the circuit, and so higher switching losses are therefore often accepted in practice.

Furthermore, load relief networks can be used to ensure that the product of voltage and current is as low as possible during a switching process. By way of example, it is known to connect a capacitor in parallel with a transistor, that capacitor accepts a load current during switch-off, such that the transistor becomes free of current and may be switched off in a manner free of power loss.

U.S. Pat. No. 5,341,004 A proposes, in order to reduce the switching losses, interconnecting in parallel with a first semiconductor switch, an IGBT (insulated-gate bipolar transistor, IGBT), a second semiconductor switch, likewise an IGBT. The second IGBT has a higher saturation voltage and a shorter fall time than the first IGBT and thus accepts current when the first IGBT is turned off, such that the current no longer flows via the first IGBT and thus establishes a power loss.

DE 3542751 A1 proposes, in order to reduce the power loss in snubber networks for semiconductor switches, connecting a saturable tapped inductor in series with the semiconductor switch and providing an ohmic resistor in parallel therewith. What is achieved thereby is that the step current flow in the forward direction that flows when the semiconductor switch is switched on is lower and accordingly causes lower losses.

By the solutions mentioned, although it is possible to reduce a power loss directly in the semiconductor switch, a corresponding power loss may generally arise at other parts of the half bridge if those energy stores that are provided for reducing the power loss are drained. As a result, the effectiveness of the measures for reducing the power loss in the semiconductor switch may also be limited, e.g. if a corresponding power cannot be dissipated rapidly enough in a controlled manner.

DE693 12 585 T2 discloses a half bridge of the generic type comprising series-connected semiconductor switches and a load relief device in order to collect energy during a switching process in the semiconductor switches.

SUMMARY

An object of the present disclosure is to provide an improved half bridge with a semiconductor switch that operates more efficiently.

EXAMPLES

One aspect of this disclosure provides a half bridge for operating a load comprises a switching device comprising a high-side semiconductor switch and a low-side semiconductor switch. The semiconductor switches are connected to one another in series in each case via one of their current terminals, wherein each semiconductor switch may be assigned, via its control terminal, a driving system that switches the respective semiconductor switch on or off according to a drive signal, and wherein the load is connectable between the high-side and low-side semiconductor switches.

The half bridge may comprise a load relief device connected to the switching device in order to collect energy during a switching process in the switching device.

The half bridge may comprise an energy recovery circuit configured to feed the energy collected by the load relief device, in particular a current, to an energy storage device before a further energy collection, in particular current collection, of the load relief device, during a further switching process in the switching device.

By the energy recovery circuit, in particular energy from the load relief device is guided away from the semiconductor switch, such that said energy may no longer be dissipated in the semiconductor switch. Additionally, or alternatively, by the energy recovery circuit energy from a load relief device may be dissipated in a controlled manner, stored for later use or fed back into a supply energy source. As a result, an object on that the disclosure is based is achieved and a more efficient half bridge is provided.

Another aspect provides a current channel that connects the load relief device to the energy storage device. The energy storage device comprises a first capacitance connected to the current channel. The first capacitance may be formed in particular by a capacitor. The capacitance is connected to the current channel in particular such that it may connect energy, in particular current, from the load relief device. Particularly if the load relief device comprises a capacitance, the first capacitance of the energy storage device is arranged such that it may collect current of the capacitance of the load relief device. In particular, the first capacitance of the energy storage device is dimensioned such that it is equal to or greater than the capacitance of the load relief device, in particular greater by the factor 2, preferably by the factor 10 and particularly preferably by the factor 100.

According to another aspect, the energy storage device comprises a second capacitance, that is connected to the current channel and is connected in parallel with the first capacitance of the energy storage device. The capacitance is formed in particular by a capacitor. In particular, the capacitance is configured to collect and in particular buffer store energy from one, a plurality or all of the energy stores of the load relief device. Preferably, said second capacitance is greater than the first capacitance, in particular greater by the factor 10, preferably by the factor 100 and particularly preferably by the factor 1000.

According to another aspect, the load relief device comprises a capacitance. A capacitance may be formed in particular by a capacitor. The capacitance is connected in parallel with the high-side semiconductor switch of the switching device. In particular, the voltage dropped across the capacitance is substantially the same as that dropped across the high-side semiconductor switch. In particular, the capacitance prevents high-frequency voltage changes across the high-side MOSFET (metal-oxide-semiconductor field-effect transistor, MOSFET). This also applies in particular to other semiconductor switches used. In particular, the capacitance is connected to the low-side semiconductor switch and the load. As a result, it may collect an energy that would still be passed through the low-side semiconductor switch upon switch-off of the low-side semiconductor switch through an inductive load.

Furthermore, the load relief device comprises an inductance. An inductance may be formed in particular by a coil. The inductance may be or have been connected to a supply potential terminal and/or is connected in series in the current path of the semiconductor switches. In particular, the inductance is connected to the drain terminal of the high-side semiconductor switch. Additionally or alternatively, the other terminal of the inductance may be connected to the positive supply potential terminal of an energy source. As a result, when the high-side semiconductor switch is switched on, an excessively high current flow in said semiconductor switch may be avoided since the coil avoids a fast current rise.

According to another aspect, the energy recovery circuit comprises a voltage converter for feeding back the electrical energy from the energy storage device into an energy supply, in particular a voltage supply, wherein the energy supply provides in particular an energy for operating the load of the half bridge. The voltage converter may be in particular a DC/DC converter. In particular, the voltage converter may comprise a buck converter that converts an input voltage into a lower output voltage. Additionally or alternatively, the voltage converter may comprise a booster converter that converts an input voltage into a higher open voltage. The voltage converter may comprise in particular one or a plurality of circuit groups for smoothing and/or stabilizing the output voltage. In particular, the voltage converter serves to transfer energy from the load relief device into an intermediate circuit or some other storage location, e.g. a rechargeable battery.

According to another aspect, the current channel of the energy recovery circuit comprises a first, a second and a third diode interconnected in series with one another. The current channel connects the load relief device to the energy storage device. In particular, one or a plurality, preferably all, of the diodes of the current channel are connected such that no current may be passed through the current channel to a semiconductor switch, in particular to the high-side semiconductor switch, but rather may only flow away from a semiconductor switch, in particular the high-side semiconductor switch. This makes it possible to ensure in particular for all phases of the half bridge, in particular switch-on and/or switch-off of the high-side semiconductor switch and/or switch-on and/or switch-off of the low-side semiconductor switch, that no current that does not come from a supply energy source flows through one of the semiconductor switches and in particular generates a power loss.

Furthermore, the current channel is connected to a node between the load relief device and the switching device. In particular, the current channel is connected to the node to that an inductance of the load relief device is also connected and/or to that the high-side semiconductor switch is also connected. As a result, advantageously, in particular during a switchover process, a current passing through the coil may be branched off via the current channel before it flows through the high-side semiconductor switch and is converted there as power loss. Additionally or alternatively, the current channel may be connected to a capacitance connected in parallel with the high-side semiconductor switch. As a result, the current channel may collect energy stored in the capacitance and said energy may be passed to the energy storage device. Preferably, a diode is connected downstream of one or a plurality, in particular all, of the nodes at that a current from the load relief device and/or the energy storage device is introduced into the current channel, specifically in particular such that current from the current channel cannot flow back into the switching device, in particular the high-side semiconductor switch, cannot flow back in an energy store of the load relief device that is located upstream of the relevant node, and/or cannot flow back into an energy store of the energy storage device that is located upstream of the relevant node.

Furthermore, the current channel comprises an inductance arranged in series with the second capacitance of the energy storage device. In particular, the inductance is formed by a coil. Preferably, the inductance is less than an inductance of the load relief device, in particular less by the factor 0.5, preferably by the factor 0.25 and particularly preferably by the factor 0.1. In particular, the coil is connected to an energy supply, and preferably safeguarded with a diode, such that no current can flow into the energy supply. The inductance of the current channel may smooth current jumps in the second capacitance of the energy storage device. Furthermore, the coil as drainage coil may reduce the energy stored in it without any disturbance if a current from the current channel suddenly peters out. The coil then drains current from the energy supply until it itself has no longer stored energy. Preferably, this energy, in particular this current, is also collected in the second capacitance of the energy storage device. This prevents oscillations within the current channel that may be excited, in particular, by a sudden current reduction and/or a sudden current rise.

The individual developments and embodiments and also the individual features thereof may be combined with one another.

BRIEF DESCRIPTION OF THE DRAWINGS

The invention is explained in greater detail below on the basis of preferred exemplary embodiments with reference to figures, in that.

DETAILED DESCRIPTION

Figure 1A:
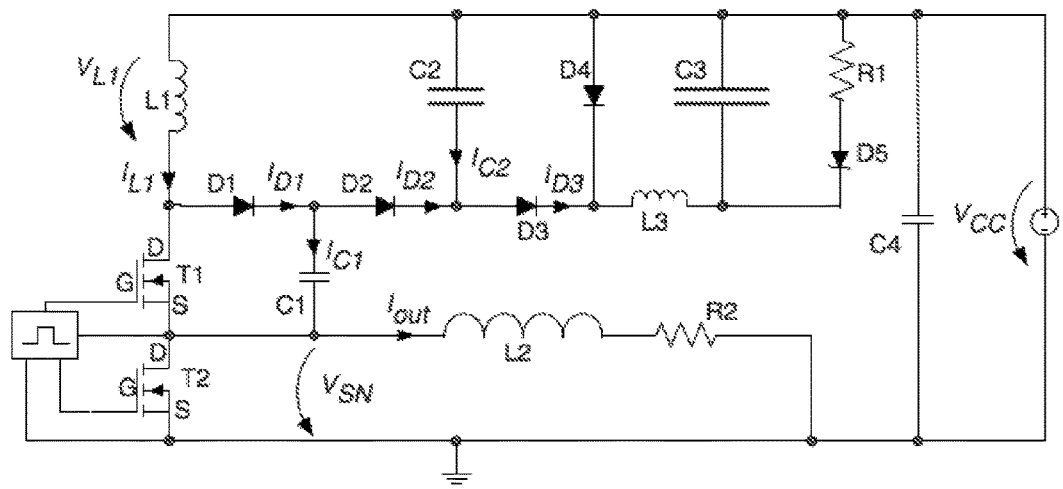
FIG. 1a shows a circuit according to one embodiment.

A half bridge for operating a load comprises a switching device including a high-side semiconductor switch and a low-side semiconductor switch.

In this case, a half bridge within the meaning of the present disclosure may comprise in particular a 2-quadrant controller or a synchronous rectifier. A half bridge may be used as an element in an H-bridge, in a B6 circuit or a correspondingly similar circuit arrangement. In particular, a half bridge may comprise a buck converter and/or a boost converter.

A load within the meaning of the present disclosure is an electrical load, e.g. a motor. In particular, a load comprises an ohmic resistance and/or an inductance. Such an inductance may comprise in particular a coil inductance of a motor.

A semiconductor switch may be a transistor or a transistor-like component, in particular a bipolar junction transistor (BJT), an insulated-gate bipolar transistor (IGBT), a field-effect transistor (FET) or a metal-oxide-semiconductor field-effect transistor. Additionally or alternatively, a semiconductor switch may be a diode, a semisistor or a similar switchable element.

A semiconductor switch substantially comprises three terminals; e.g., a control terminal and two current terminals. A current conductivity of the semiconductor switch may be set via a control terminal; in particular, the semiconductor switch may be switched on, that is to say switched to be conducting, and switched off, that is to say switched to be blocking, via the control terminal. A load circuit may be operated via the two current terminals. By way of example, in the case of a MOSFET, the control terminal is the gate terminal. In the case of a MOSFET, the current terminals are firstly the source terminal and secondly the drain terminal.

The semiconductor switches are connected to one another in series in each case via one of their current terminals. The semiconductor switches may be interconnected in series between a first supply potential terminal, connected at least indirectly to the high-side semiconductor switch, and a second supply potential terminal, connected at least indirectly to the low-side semiconductor switch.

A supply potential terminal is, in particular, a terminal of an energy source, in particular of a voltage source. Alternatively, a supply potential terminal may also be a terminal of a current source. An energy source may be in particular an intermediate circuit.

Each semiconductor switch may be assigned, via its control terminal, a driving system that may switch the respective semiconductor switch on or off according to a drive signal.

A driving system is, in particular, a gate driver. The driving system is connected to the gate, or a control terminal corresponding to the gate, of the semiconductor switch. In particular, both transistors are operated by a single driving system; in particular, e.g., such that both semiconductor switches are not switched on simultaneously. In particular, one semiconductor switch is switched off, while the other semiconductor switch is switched on; in this case, preferably, first one semiconductor switch is switched off and shortly afterward the other semiconductor switch is switched on.

A drive signal comprises, in particular, substantially constant low and high levels. In this case, a low level of the drive signal present at the control terminal brings about, in particular, a switch-off of the semiconductor switch. Additionally, or alternatively, a high level present at the control terminal brings about a switch-on of the semiconductor switch. In particular, a drive signal is a pulse-width-modulated signal.

The load is connectable between the high-side and low-side semiconductor switches. In particular, the load is connected at least indirectly between a source terminal of the high-side semiconductor switch and a drain terminal of the low-side semiconductor switch.

The half bridge comprises a load relief device connected to the switching device in order to collect current during a switching process in the switching device. Such a current may be, in particular, a current that would flow through one of the two semiconductor switches without the load relief device. Such a load relief device may comprise, in particular, a circuit network comprising passive components.

A switching process is, in particular, a switchover of a semiconductor switch from a switched-on state to a switched-off state. Additionally or alternatively, a switching process may also comprise a switchover from a switched-off state to a switched-on state. In particular, the switching process comprises a phase in that a semiconductor switch is designated neither as switched on nor as switched off. In particular, a switch-on phase of a semiconductor switch is shorter than a switch-off phase of said semiconductor switch.

FIG. 1a shows a circuit arrangement comprising a half bridge consisting of two MOSFET transistors T1, T2. The MOSFETs are driven via their respective gate terminals G, wherein the driving system provides in particular a pulse-width-modulated signal.

The MOSFETs T1, T2 are two normally off n-channel MOSFETs e.g. of the FCB36N60N type from the manufacturer Fairchild Semiconductor Corp., San Jose, USA. A supply voltage $V_{CC}$ provides the current that is intended to be controlled by the MOSFETs. A first MOSFET (high-side MOSFET), T1 is connected by its drain current terminal D to a supply potential terminal of the supply voltage $V_{CC}$ via an inductance L1.

A second MOSFET (low-side MOSFET) T2 is connected to the high-side MOSFET T1 in series such that the source current terminal S of the high-side MOSFET T1 is connected to the drain current terminal D of the low-side MOSFETS T2. The source terminal of the second MOSFET T2 is connected by connection to the second supply potential terminal of the energy supply $V_{CC}$ and is at ground potential as reference potential.

A current channel D1, D2, D3, L3 is branched off between the coil L1 and the high-side MOSFET T1, said current channel being protected via a diode D1 such that a current may flow away via said channel only from the drain terminal of the high-side MOSFET T1.

Downstream of the diode D1, the current channel is split into a first current branch, that leads via a capacitor C1 to the source terminal of the high-side MOSFET T1, and a second current branch, that leads via a diode D2 to a capacitor C2, that together with the coil L1 is at the positive potential of the supply voltage source $V_{CC}$.

The current channel is part of the energy recovery circuit. The energy stored in the load relief device L1, C1 may be removed from the MOSFETs in a controlled manner through said current channel.

A current branch leading to an inductance L3 is led off between the diode D2 and the capacitor C2. Said inductance is connected to a capacitor C3 the terminal of that on the opposite side is coupled to the positive potential of the supply voltage $V_{CC}$. Located in parallel therewith is a further current branch comprising a resistance R1, that is connected to the inductance L3 via a Zener diode D5.

The energy stores C2, C3 are likewise part of the energy recovery circuit. By this, it is possible to buffer store the energy from the current channel in a controlled manner.

An inductive load formed by a DC motor comprising an inductance L2 and an ohmic resistance R2 is connected, on the input side, to the node between series-coupled current terminals of the MOSFETs T1 and T2 and is connected, on the output side, to the ground potential of the energy source $V_{CC}$, that is to say also to the source current terminal of the low-side MOSFET T2.

A capacitor C4 is located in parallel with the supply voltage and, on the input side, at the same potential as the inductance L1 and, on the output side, at ground potential, said capacitor being used in particular for smoothing the voltage present across the MOSFETS T1, T2. The voltage $V_{SN}$ is dropped across the load and the voltage $V_{L1}$ is dropped across the inductance L1.

Figure 2:
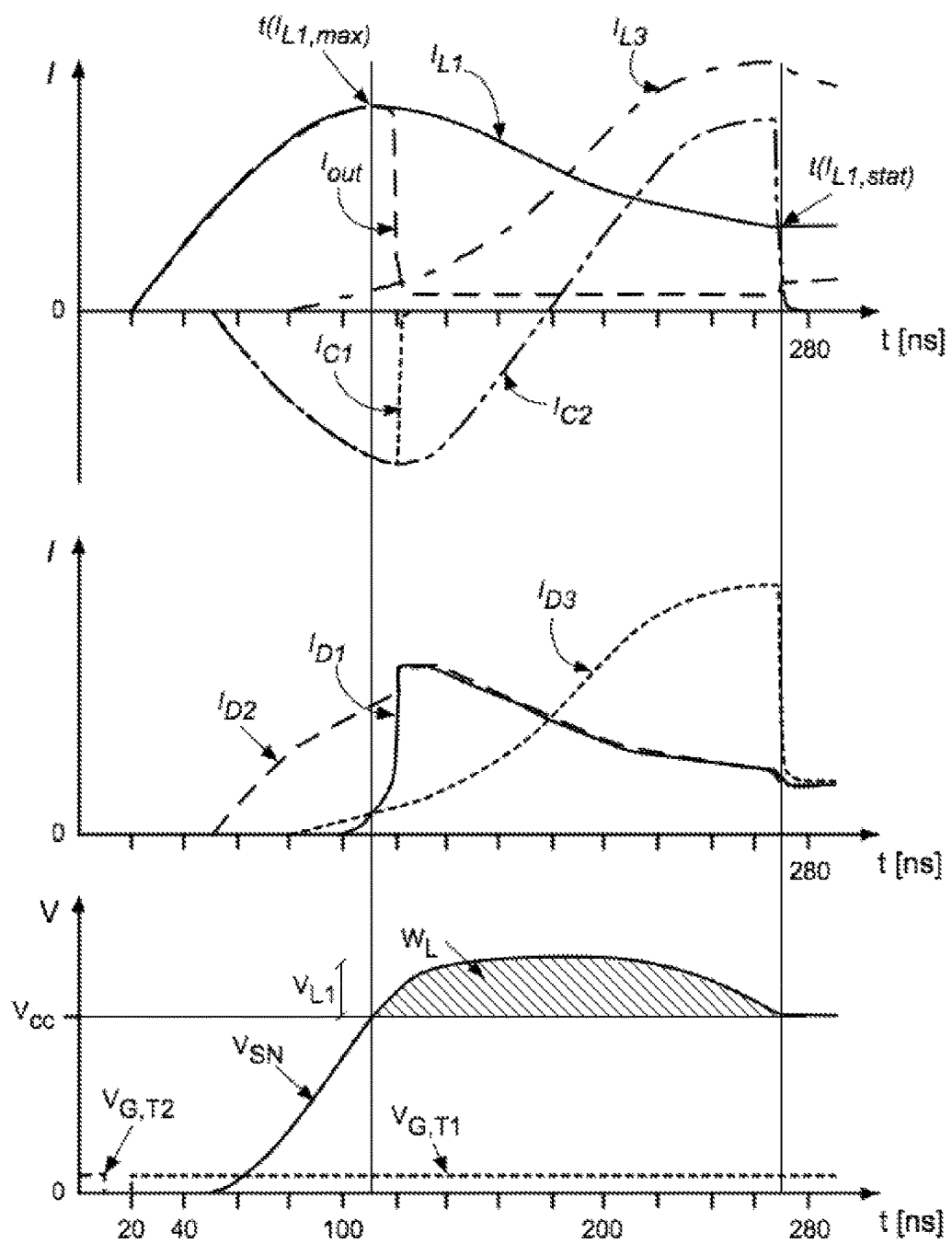
FIG. 2 shows voltage and current signals of a circuit according to one embodiment for a switch-on process of the high-side MOSFETs.

The dynamic processes for switching on the first MOSFET (high-side MOSFET) T1 are described below. Said processes may correspondingly deviate in detail from the embodiment described here depending on the interconnection and arrangement of the passive and active elements in another embodiment. To that end, corresponding current and voltage signals are plotted against time t=0 ns to t=280 ns in FIG. 2, said signals reproducing a basic profile. In reality, the signals may in particular also be subjected to noise and interference signals. Moreover, the signals may also comprise dynamic processes, in particular with a shorter transient recovery time.

By the pulse-width-modulated control signal, the gate terminal G of the high-side MOSFET T1 is driven such that the latter becomes current-conducting. Beforehand the gate terminal G of the low-side MOSFET T2 is driven by the gate driver such that it turns off, in this case with a zero signal. The voltage signals from the gate driver are plotted in the lower diagram in FIG. 2. It is evident that the low-side MOSFET T2 is switched off at a time of 10 ns by virtue of the associated gate voltage $V_{G,T2}$ decreasing to 0 volts.

In addition, it is evident that the gate voltage $V_{G,T1}$ of the first MOSFET T1 rises at a time of 20 ns to the constant reference voltage, that causes said MOSFET to conduct between its current terminals drain D and source S, such that said MOSFET is switched on.

A switch-on process of the MOSFETs used generally has a longer duration than a switch-off process. The switch-off reference signal of the gate terminal of the low-side MOSFET T2 is implemented 10 ns earlier than the switch-on reference signal of the gate terminal of the high-side MOSFET T1. As a result of the finite switch-off process of the low-side MOSFET T2 and the faster switch-on process of the high-side MOSFET T1, for a time both MOSFETs are at least partly conducting, that might lead to a high current, in particular a short-circuit current. The coil L1 prevents a high current in the MOSFETs by limiting the current rise in the current path of the MOSFETs. Higher switching frequencies are possible as a result.

After the switch-on of the high-side MOSFET T1, a current path via the inductance L1 and the high-side MOSFET T1 to the load L2, R2 is opened. Accordingly, the current through the inductance L1 firstly rises linearly before transitioning into a saturation that peaks at a maximum. This can be discerned in the upper diagram in FIG. 2.

Owing to the inertia of the inductance L1, initially a current flow through the high-side MOSFET T1 is not yet established. The voltage across the load $V_{SN}$ increases. Firstly the capacitor C1 discharges via the channel diode D2, that capacitor had been charged in the switch-off phase of the second low-side MOSFET T2 that took place beforehand. The charge stored in the capacitor C1 is transferred via the current $I_{C1}$ into a first buffer store, represented by the capacitor C2. The capacitor C1 thus discharges simultaneously while the capacitor C2 is charged, as evident in the upper diagram in FIG. 2. The associated channel current of the diode D2 is depicted in the middle diagram in FIG. 2.

As it were with the discharge of the capacitor C1 a voltage drop $V_{SN}$ arises across the load L2, R2, said voltage drop initially rising linearly. Firstly, a current flow through the load is limited by the inductance L1. Energy that could otherwise be dissipated as power loss in the high-side MOSFET T1 is thus firstly stored in the inductance. The maximum current flow through the coil L1 is attained at a time $t(I_{L1,max})$:=110 ns. This is discernable in the upper diagram in FIG. 2. In the lower diagram in FIG. 2 it is evident that at the point in time of the maximum current flow $t(I_{L1,max})$ through the coil L1 the voltage across the load $V_{SN}$ corresponds exactly to the supply voltage $V_{CC}$ since, at this point in time, the capacitor C1 is discharged and forwards the potential downstream of the diode D1 directly to the load.

Starting approximately from the point in time t=100 ns a current $I_{D1}$ begins to flow from the inductance L1 through the diode D1 of the current channel. The discharge process of the capacitor C1 is concluded at the point in time 120 ns, such that the current $I_{L1}$ from the inductance L1 may them also commutate from the MOSFET T1 to the diode D1.

The current $I_{D1}$ from diode D1 then flows further via diode D2. The charging of the capacitor C2 leads to an increase in potential between the diode D2 and the diode D3, as a result of that the diode D3 becomes conducting. As a result, the current flows from the inductance L1 via diodes D1, D2, D3 into the inductance L3. This is illustrated on the basis of the rising current signal $I_{D3}$ in the middle diagram in FIG. 2.

The current low-pass filtered by the inductance L3 then flows into the capacitor C3. This capacitor serves as a second store of the current $I_{L1}$ driven, in particular, by the inductance L1.

After the capacitor C1 has discharged, it is only charged again if the low-side MOSFET T2 turns off. The capacitor C1 thus also serves as a compensator for voltage jumps both across the load and across the low-side MOSFET T2.

The current flow from the inductance L1 through the current channel via the diode D1 and/or via the diode D2 to the inductance L3 exhibits a voltage drop $V_{SN}$ across the load that exceeds the supply voltage $V_{cc}$. This voltage boost is based on the energy that is stored in the inductance L1 after the latter has been correspondingly charged. This is marked by the hatched region $W_L$ in the lower diagram in FIG. 2.

Since the inductance L1 acts as inertia, with respect to the current driven by it, although a voltage higher than that provided by the supply voltage is dropped across the load, the current based on this boost flows neither through the conducting high-side MOSFET T1 nor through the blocking low-side MOSFET T2 and thus does not establish any power loss dissipated in these components.

Moreover, the power loss is dissipated into the main store C3 of the energy storage device via the current channel that is continuous through the diodes D1, D2, D3 only in one direction. From this main store established by the capacitor C3, the current may be led away into a resistance network R1 in order to dissipate it there in a controlled manner, without loading the MOSFETs. In the present case, the ballast resistance R1 is dimensioned with 10 ohms.

Figure 1B:
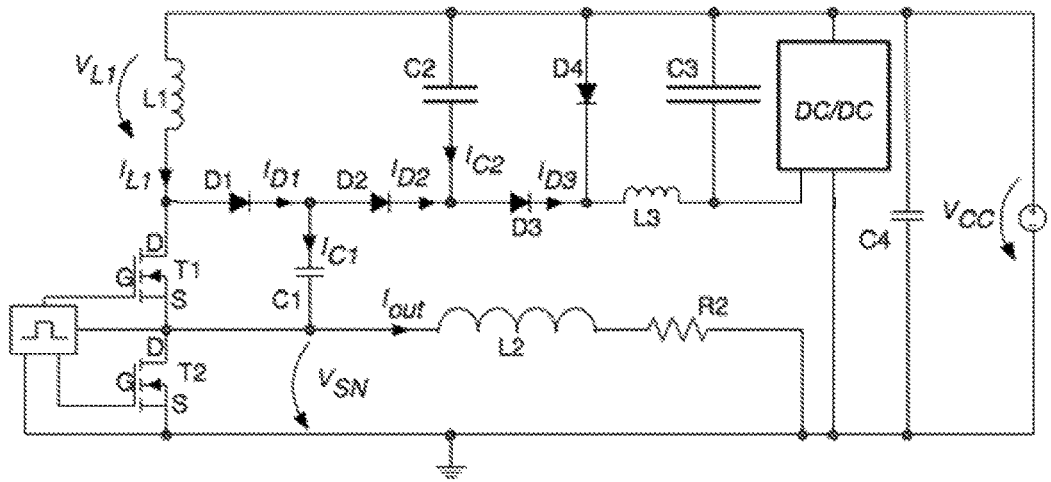
FIG. 1b shows a circuit according to a further embodiment.

In the alternative embodiment illustrated in FIG. 1b, the power loss kept away from the MOSFETs is fed back into the energy supply. An energy recovery network required for this purpose may comprise in particular a DC/DC converter DC/DC in order to transform the recoverable energy to a voltage of the energy supply, e.g. to a voltage of the intermediate circuit. Additionally or alternatively, an energy recovery network may also comprise a buck converter and/or a boost converter. Thus, advantageously, a large part of the power loss is not just kept away from the MOSFETs rather said part is recycled in an energy-neutral fashion.

After approximately 270 ns, the current flow from the diode D3 is abruptly reduced since the capacitor C2, that is to say the buffer store, is completely discharged. The current through the diode D3 now corresponds to the current $I_{D1}$ or $I_{D2}$, that is now slowly accepted by the high-side MOSFET T1. At this point in time, the energy store of the inductance L1 is completely drained and the voltage $V_{SN}$ across the load has attained a static value. The current through the inductance L3 then commutates from the diode D3 to the diode D4 since the inductance L3 would like to maintain its current flow. The inductance L3 then acts as "drainage inductor" and draws current via the diode D4 until the energy stored in it is used up. By this, too, abrupt current changes in the current path to the capacitor C3 are avoided.

In an embodiment that is not illustrated, oscillations generated during a commutation of the current between D3 and D4 may be damped by an RC low-pass filter, that may be arranged in particular in parallel with the diode D4.

Depending on the capacitance of the capacitor C2, an approximately constant voltage is present at the node between the inductance L3 and the storage capacitor C3.

In this case, the capacitance of the capacitor C1 with a value of 680 pF is smaller than the capacitance of the capacitor C2, that is 4 nF. The reason for this is that the capacitor C1 is used for avoiding voltage jumps across the MOSFETs, the capacitor C2 being provided as buffer store in particular for the charge originating from the capacitor C1. With a value of 2000 nF the capacitor C3 is dimensioned as a large buffer store in order to receive both the charge from the capacitor C1 via the capacitor C2 and the energy stored by the coil L1, that constitutes a large part of the energy otherwise dissipated in the MOSFET T1. The smoothing capacitor C4 is dimensioned with 50 µF.

The inductance of the coil L1 with a value of 2.7 µH is dimensioned to be larger than the inductance of the coil L3, that is dimensioned with 1 µH. The reason for this is that the coil L3 is designed as an energy store for the energy otherwise accumulating as power loss in the high-side MOSFET T1 during a switchover process. The inductance L2 of the load may be significantly larger and is approximately 100 µH in the present case.

To summarize, the reduction of power loss is implemented firstly by a parallel-connected capacitor C1 that prevents in particular voltage jumps at the high-side MOSFET T1 and thus minimizes a product of voltage and current because the voltage dropped across the transistor in the current path is approximately 0V. The capacitor C1 prevents a rapid voltage rise for the transistors by virtue of the fact that it "collects at the top" current changes and thus results in a relatively slow voltage change, its charging curve. In this case the capacitor C1 collects electrical energy, the loading on the transistors is relieved for their switching time and they dissipate hardly any power loss. This energy is located instead on the capacitor C1.

For the next switching process, the energy has to be removed from the capacitor C1 in order that the latter may operate once again in the manner described above. The buffer storage capacitor C2 and the current channel through the diodes D2, D3 and the coil L3 to the main storage capacitor C3 serve for transporting away said energy.

Secondly, the inductance L1 connected in series with the MOSFETs prevents a sudden current rise. In this regard, the switchover of the capacitor mentioned above may take place without high currents that may lead to a high power loss and possibly even destroy the capacitor. Moreover, a very high shunt current or a short circuit is prevented by the coil L1 upon the elementary switch-on of both transistors, that should actually be avoided. After the coils have experienced an increase in current at the point in time of the switching of the transistors, their current has to be reduced again to the value 0 amperes or to the level of the output current $I_{Out}$ of the circuit. This change/reduction in current may be achieved by dissipating energy. This dissipation of energy is implemented via the current channel that leads through the diodes D1, D2 to the buffer store C2 and/or further via the diode D3 and the inductance L2 to the main storage capacitor C3.

From the main storage capacitor C3, the power loss kept away from the transistors may be dissipated for example in a controlled manner in a ballast resistance network or be fed into the energy supply again via a recovery circuit, in particular a DC/DC converter.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

What is claimed is:

1. A half bridge for operating a load comprising:
   a switching device comprising a high-side semiconductor switch and a low-side semiconductor switch, that are connected to one another in series in each case via one of their current terminals, wherein the load is connectable between the high-side and low-side semiconductor switches;
   a load relief device connected to the switching device in order to collect energy during a switching process in the switching device;
   an energy storage device comprising a first capacitance; and
   an energy recovery circuit configured to feed the energy collected by the load relief device to the energy storage device before a further energy collection of the load relief device during a further switching process in the switching device, wherein the energy recovery circuit comprises a current channel that connects the load relief device to the first capacitance of the energy storage device, wherein the load relief device comprises a second capacitance, that is connected to the current channel and is connected in parallel with the first capacitance.

2. The half bridge according to claim 1, wherein the load relief device comprises a capacitance connected in parallel with the high-side semiconductor switch of the switching device, and an inductance connected in series with the semiconductor switches.

3. The half bridge according to claim 2, wherein the current channel branches off between the inductance and the semiconductor switches and comprises a first, second and third diode and an inductance, that are interconnected in series with one another, wherein the current channel downstream of the first diode splits into a first current branch comprising the capacitance of the load relief device and into a second current branch, that leads via the second diode to the first capacitance of the energy storage device, wherein a third current path branches off from the second current path downstream of the second diode, said third current path leading via the third diode and the inductance to the second capacitance of the energy storage device.

4. The half bridge according to claim 3, wherein a further diode is provided, that is connected in parallel with the third diode of the current channel.

5. The half bridge according to claim 1, wherein the energy recovery circuit comprises a voltage converter for feeding back the electrical energy from the energy storage device into an energy supply of the half bridge.

6. The half bridge according to claim 1, wherein each semiconductor switch is assigned, via a control terminal, a driving system that switches the respective semiconductor switch on or off according to a drive signal.

7. A half bridge for operating a load comprising:
a switch device comprising a high-side semiconductor switch and a low-side semiconductor switch, that are connected to one another in series in each case via one of their current terminals, wherein each semiconductor switch may be assigned, via a control terminal, a driving system that switches the respective semiconductor switch on or off according to a drive signal, and wherein the load is connectable between the high-side and low-side semiconductor switches;
a load relief device connected to the switch device in order to collect energy during a switching process in the switch device;
an energy storage device comprising a first capacitance; and
an energy recovery circuit configured to feed the energy collected by the load relief device to the energy storage device before a further energy collection of the load relief device during a further switching process in the switch device, wherein the energy recovery circuit comprises a current channel that connects the load relief device to the first capacitance of the energy storage device,
wherein the energy storage device comprises a second capacitance, that is connected to the current channel, wherein the first capacitance and the second capacitance in each case branch away from the current channel, such that the second capacitance is connected in parallel with the first capacitance relative to the current channel, and wherein the second capacitance is designed to collect the energy from all the energy stores of the load relief device and the first capacitance.

8. The half bridge according to claim 7, wherein the load relief device comprises a capacitance connected in parallel with the high-side semiconductor switch of the switch device via a first diode of the current channel, and an inductance connected in series with the semiconductor switches.

9. The half bridge according to claim 8, wherein the current channel branches off between the inductance of the load relief device and the semiconductor switches and comprises a second and third diode and an inductance, wherein the first diode, the second diode, the third diode and the inductance of the current channel are interconnected in series with one another, wherein the current channel downstream of the first diode splits into a first current branch comprising the capacitance of the load relief device and into a second current branch, that leads via the third diode to the first capacitance of the energy storage device, wherein a third current path branches off from the second current path downstream of the second diode, said third current path leading via the third diode and the inductance of the current channel to the second capacitance of the energy storage device.

10. The half bridge according to claim 9, wherein provision is made of a further diode in a further current branch, wherein the further current branch with the further diode branches off from the current channel between the first diode and the inductance of the current channel, such that the further diode is arranged in parallel with the third diode of the current channel.

11. The half bridge according to claim 7, wherein the energy recovery circuit comprises a voltage converter for feeding back the electrical energy from the energy storage device into an energy supply of the half bridge.

12. A half bridge for operating a load comprising:
a switch device, wherein the switch device comprises a high-side semiconductor switch and a low-side semiconductor switch, that are connected to one another in series in each case via one of their current terminals, wherein the load is connectable between the high-side and low-side semiconductor switches;
a load relief device connected to the switch device in order to collect energy during a switching process in the switch device;
an energy storage device comprising a first capacitance; and
an energy recovery circuit configured to feed the energy collected by the load relief device to the energy storage device before a further energy collection of the load relief device during a further switching process in the switch device, wherein the energy recovery circuit comprises a current channel that connects the load relief device to the first capacitance of the energy storage device,
wherein the energy storage device comprises a second capacitance, that is connected to the current channel, wherein the first capacitance and the second capacitance in each case branch away from the current channel, such that the second capacitance is connected in parallel with the first capacitance relative to the current channel, wherein the second capacitance is dimensioned greater than the first capacitance.

13. The half bridge according to claim 12,
wherein each semiconductor switch is assigned, via a control terminal, a driving system that switches the respective semiconductor switch on or off according to a drive signal, and
wherein the load relief device comprises a capacitance connected in parallel with the high-side semiconductor switch of the switch device via a first diode of the current channel, and an inductance connected in series with the semiconductor switches.

14. The half bridge according to claim 13, wherein the current channel branches off between the inductance of the load relief device and the semiconductor switches and comprises a second and third diode and an inductance, wherein the first diode, the second diode, the third diode and the inductance of the current channel are interconnected in series with one another, wherein the current channel downstream of the first diode splits into a first current branch comprising the capacitance of the load relief device and into a second current branch, that leads via the third diode to the first capacitance of the energy storage device, wherein a third current path branches off from the second current path downstream of the second diode, said third current path leading via the third diode and the inductance of the current channel to the second capacitance of the energy storage device.

15. The half bridge according to claim 14, wherein provision is made of a further diode in a further current branch, wherein the further current branch with the further diode branches off from the current channel between the first diode and the inductance of the current channel, such that the further diode is arranged in parallel with the third diode of the current channel.

16. The half bridge according to claim 12, wherein the energy recovery circuit comprises a voltage converter for feeding back the electrical energy from the energy storage device into an energy supply of the half bridge.

* * * * *